United States Patent
Kim et al.

(10) Patent No.: US 12,516,220 B2
(45) Date of Patent: Jan. 6, 2026

(54) CMP SLURRY COMPOSITION FOR POLISHING TUNGSTEN PATTERN WAFER AND METHOD OF POLISHING TUNGSTEN PATTERN WAFER USING THE SAME

(71) Applicant: SAMSUNG SDI CO., LTD., Yongin-si (KR)

(72) Inventors: Won Jung Kim, Suwon-si (KR); Yoon Young Koo, Suwon-si (KR); Hyeong Mook Kim, Suwon-si (KR); Tae Won Park, Suwon-si (KR); Eui Rang Lee, Suwon-si (KR); Jong Won Lee, Suwon-si (KR); Youn Jin Cho, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 901 days.

(21) Appl. No.: 17/479,284

(22) Filed: Sep. 20, 2021

(65) Prior Publication Data

US 2022/0112401 A1    Apr. 14, 2022

(30) Foreign Application Priority Data

Oct. 14, 2020   (KR) .................. 10-2020-0133040

(51) Int. Cl.
  *C09G 1/02*    (2006.01)
  *C09K 3/14*    (2006.01)
  *H01L 21/304*  (2006.01)

(52) U.S. Cl.
  CPC .............. *C09G 1/02* (2013.01); *C09K 3/1454* (2013.01); *H01L 21/304* (2013.01)

(58) Field of Classification Search
  CPC ...... C09G 1/02; C09K 3/1436; C09K 3/1454; H01L 21/304; B24B 37/044
  See application file for complete search history.

(56) References Cited

U.S. PATENT DOCUMENTS

| | | | |
|---|---|---|---|
| 2008/0081469 A1 | 4/2008 | Kim | |
| 2009/0081871 A1* | 3/2009 | Dysard | C09K 3/1463 438/693 |
| 2009/0081927 A1* | 3/2009 | Grumbine | C09K 3/1436 451/36 |
| 2009/0087988 A1* | 4/2009 | Saie | H01L 21/3212 438/693 |
| 2015/0291764 A1 | 10/2015 | Yuan et al. | |
| 2015/0376458 A1* | 12/2015 | Grumbine | C09G 1/02 252/79.1 |
| 2015/0376462 A1* | 12/2015 | Fu | H01L 21/31053 438/693 |

FOREIGN PATENT DOCUMENTS

| | | |
|---|---|---|
| CN | 106575614 A | 4/2017 |
| CN | 107001913 A | 8/2017 |
| CN | 108350318 A | 7/2018 |
| CN | 110669438 A | 1/2020 |
| CN | 110734703 A | 1/2020 |
| CN | 111471401 A | 7/2020 |
| JP | 2011-216582 A | 10/2011 |
| JP | 2017/524767 A | 8/2017 |
| KR | 10-1427883 B1 | 8/2014 |
| KR | 10-2017-0021323 A | 2/2017 |
| KR | 10-2017-0026491 A | 3/2017 |
| TW | 201612285 A | 4/2016 |
| WO | WO 2014/058014 A1 | 4/2014 |

OTHER PUBLICATIONS

Taiwanese Office action dated Mar. 28, 2022.
Korean Notice of Allowance issued on Jun. 20, 2024, in the corresponding Korean Patent Application No. 10-2020-0133040.
Korean Office Action issued Oct. 18, 2023, in the corresponding Korean Patent Application No. 10-2020-0133040.
Chinese Office action dated Oct. 19, 2022.
Japanese Office action dated Jul. 1, 2025.

* cited by examiner

*Primary Examiner* — Alexandra M Moore
(74) *Attorney, Agent, or Firm* — Lee IP Law, P.C.

(57) ABSTRACT

A CMP slurry composition for polishing a tungsten pattern wafer and a method of polishing a tungsten pattern wafer, the composition including a solvent; and an abrasive agent, wherein the abrasive agent includes silica modified with polyethyleneimine-derived aminosilane, and the composition has a pH of about 4 to about 7.

7 Claims, No Drawings

CMP SLURRY COMPOSITION FOR POLISHING TUNGSTEN PATTERN WAFER AND METHOD OF POLISHING TUNGSTEN PATTERN WAFER USING THE SAME

CROSS-REFERENCE TO RELATED APPLICATION

This application claims the benefit of Korean Patent Application No. 10-2020-0133040, filed on Oct. 14, 2020 in the Korean Intellectual Property Office, the entire disclosure of which is incorporated herein by reference.

BACKGROUND

1. Field

Embodiments relate to a CMP slurry composition for polishing a tungsten pattern wafer and a method of polishing a tungsten pattern wafer using the same.

2. Description of the Related Art

A chemical mechanical polishing (CMP) composition and a method of polishing (or flattening) a surface of a substrate have been considered. A polishing composition for polishing a metal layer (e.g., a tungsten layer) on a semiconductor substrate may include abrasive particles suspended in an aqueous solution and chemical accelerators, e.g., an oxidizing agent, a catalyst, or the like.

SUMMARY

The embodiments may be realized by providing a CMP slurry composition for polishing a tungsten pattern wafer, the composition including a solvent; and an abrasive agent, wherein the abrasive agent includes silica modified with polyethyleneimine-derived aminosilane, and the composition has a pH of about 4 to about 7.

The polyethyleneimine-derived aminosilane may include a reaction product of polyethyleneimine and a compound of Formula 1, a cation of the reaction product, or a salt of the reaction product,

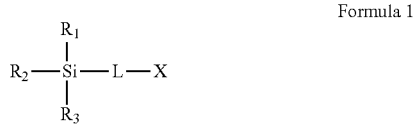

Formula 1 in Formula 1, L is a substituted or unsubstituted $C_1$ to $C_{20}$ alkylene group, a substituted or unsubstituted $C_3$ to $C_{20}$ cycloalkylene group, a substituted or unsubstituted $C_6$ to $C_{20}$ arylene group, or a combination thereof; X is F, Cl, Br, I, an epoxy group, or a glycidyloxy group; and $R_1$ to $R_3$ are each independently hydrogen, a hydroxyl group, a substituted or unsubstituted $C_1$ to $C_{20}$ alkyl group, a substituted or unsubstituted $C_3$ to $C_{20}$ cycloalkyl group, a substituted or unsubstituted $C_6$ to $C_{20}$ aryl group, a substituted or unsubstituted $C_1$ to $C_{20}$ alkoxy group, or a substituted or unsubstituted $C_6$ to $C_{20}$ aryloxy group, at least one of $R_1$ to $R_3$ being a hydroxyl group, a substituted or unsubstituted $C_1$ to $C_{20}$ alkoxy group, or a substituted or unsubstituted $C_6$ to $C_{20}$ aryloxy group.

In Formula 1, L may be a substituted or unsubstituted $C_1$ to $C_5$ alkylene group, X may be Cl or a glycidyloxy group, and $R_1$ to $R_3$ may each independently be a hydroxyl group, a substituted or unsubstituted $C_1$ to $C_5$ alkyl group, or a substituted or unsubstituted $C_1$ to $C_5$ alkoxy group, at least one of $R_1$ to $R_3$ being a hydroxyl group or a substituted or unsubstituted $C_1$ to $C_5$ alkoxy group.

The compound of Formula 1 may be chloropropyltrimethoxysilane, chloropropyltriethoxysilane, glycidyloxypropyltrimethoxysilane, or glycidyloxypropyltriethoxysilane.

The polyethyleneimine may have a weight average molecular weight (Mw) of about 500 g/mol to about 1,000,000 g/mol, as measured by gel permeation chromatography (GPC).

The silica modified with the polyethyleneimine-derived aminosilane may have a positive charge on a surface thereof, a surface potential of about 10 mV to about 60 mV, and an isoelectric point of the silica is present at a pH of about 6 to about 10.

The silica modified with the polyethyleneimine-derived aminosilane may have an average particle diameter (D50) of about 10 nm to about 200 nm.

The CMP slurry composition may further include an oxidizing agent, a catalyst, or an organic acid.

The composition may include about 0.001 wt % to about 20 wt % of the abrasive agent; about 0.01 wt % to about 20 wt % of the oxidizing agent; about 0.001 wt % to about 10 wt % of the catalyst; about 0.001 wt % to about 20 wt % of the organic acid; and the solvent, all wt % being based on a total weight of the composition.

The embodiments may be realized by providing a method of polishing a tungsten pattern wafer, the method including polishing the tungsten pattern wafer using the CMP slurry composition according to an embodiment.

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey exemplary implementations to those skilled in the art.

It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present.

Herein, the singular forms "a", "an" and "the" are intended to include the plural forms as well, unless the context clearly indicates otherwise. As used herein, the term "or" is not an exclusive term, e.g., "A or B" would include A, B, or A and B.

Further, the terms "comprise," "include," and "have," when used in this specification, specify the presence of stated features, steps, operations, elements, and/or components, but do not preclude the presence or addition of one or more other features, steps, operations, elements, components, or groups.

Herein, at least one of a substituted $C_1$ to $C_{20}$ alkylene group, a substituted $C_3$ to $C_{20}$ cycloalkylene group, a substituted $C_6$ to $C_{20}$ arylene group, a substituted $C_1$ to $C_{20}$ alkyl group, a substituted $C_3$ to $C_{20}$ cycloalkyl group, a substituted $C_6$ to $C_{20}$ aryl group, a substituted $C_1$ to $C_{20}$ alkoxy group, and a substituted $C_6$ to $C_{20}$ aryloxy group may be selected from among a $C_1$ to $C_{20}$ alkyl group, a $C_3$ to $C_{20}$ cycloalkyl group and a $C_6$ to $C_{20}$ aryl group.

Further, a numerical value related to a certain component is construed to include a tolerance range in interpretation of components, unless clearly stated otherwise.

As used herein to represent a specific numerical range, the expression "a to b" is defined as "≥a and ≤b".

In a CMP slurry composition for polishing a tungsten pattern wafer, which may include a solvent and an abrasive agent, the polishing rate of the tungsten pattern wafer and flatness of a polished surface of the tungsten pattern wafer may be improved through reduction of erosion while suppressing generation of scratch defects upon polishing of the tungsten pattern wafer, when abrasive particles modified with polyethyleneimine-derived aminosilane are used as the abrasive agent. In addition, an improvement in polishing rate of the tungsten pattern wafer and flatness of the polished surface of the tungsten pattern wafer may be achieved using silica modified with polyethyleneimine-derived aminosilane as the abrasive agent under a sub-acidic pH condition, as compared with a strong acid condition, e.g., having a pH of 1 to 3.

In accordance with an embodiment, a CMP slurry composition for polishing a tungsten pattern wafer (hereinafter referred to as "CMP slurry composition") may include a solvent and an abrasive agent. The abrasive agent may include silica modified with polyethyleneimine-derived aminosilane. The composition may have a pH of about 4 to about 7, e.g., 4 to 7.

Hereinafter, components of the CMP slurry composition according to the embodiment will be described in detail.

Solvent

The solvent may help reduce friction upon polishing a tungsten pattern wafer with an abrasive agent. The solvent may be a polar solvent, a non-polar solvent, or a combination thereof. In an implementation, the solvent may include water (e.g., ultrapure water or deionized water), an organic amine, an organic alcohol, an organic alcohol amine, an organic ether, an organic ketone, or the like. In an implementation, the solvent may be, e.g., ultrapure water or deionized water. In an implementation, the solvent may be included in the balance amount in the CMP slurry composition.

Abrasive Agent

The abrasive agent may polish an insulating layer (e.g., a silicon oxide layer) and a tungsten pattern wafer at a high polishing rate.

The abrasive agent, e.g., silica modified with polyethyleneimine-derived aminosilane, may include spherical or non-spherical particles. In an implementation, the abrasive agent may have an average particle diameter (D50) of, e.g., about 10 nm to about 200 nm (e.g., 10 nm, 20 nm, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, or 200 nm), about 20 nm to about 180 nm, or about 40 nm to 130 nm. Within this range, the CMP slurry composition may help secure a sufficient polishing rate with respect to the insulating layer and the tungsten pattern wafer, which are polishing targets, without generating surface defects (e.g., scratches or the like) upon polishing. The "average particle diameter (D50)" means the diameter of particles corresponding to about 50 vol % in a volume distribution of the abrasive agent.

In the CMP slurry composition, the abrasive agent, e.g., silica modified with polyethyleneimine-derived aminosilane, may be present in an amount of, e.g., about 0.001 wt % to 20 wt %, about 0.01 wt % to 10 wt %, about 0.05 wt % to 5 wt %, or about 0.5 wt % to 3 wt %, all wt % being based on a total weight of the composition. Within this range, the CMP slurry composition may help secure a sufficient polishing rate of the insulating layer and the tungsten pattern wafer while securing dispersion stability of the composition without generating scratches.

The abrasive agent may include silica modified with polyethyleneimine-derived aminosilane.

Polyethyleneimine is an amine-based polymer having a repeat unit of an amine group and a $CH_2CH_2$ spacer, and includes a plurality of nitrogen atoms. Silica modified with polyethyleneimine-derived aminosilane having a plurality of nitrogen atoms may have much better effects in terms of the polishing rate of the tungsten pattern wafer and improvement in flatness of the tungsten pattern wafer, as compared with non-modified silica or silica modified with aminosilane having a small number of nitrogen atoms (e.g., one or two nitrogen atoms). In addition, the CMP slurry composition containing the silica modified with the polyethyleneimine-derived aminosilane may help realize a high polishing rate of the tungsten pattern wafer and improvement in flatness of the tungsten pattern wafer upon polishing in a sub-acidic pH condition, as compared with in a strongly acidic condition.

The polyethyleneimine may be a linear polyethyleneimine, a branched polyethyleneimine, or a combination thereof. In an implementation, the linear polyethyleneimine may be represented by Formula A and the branched polyethyleneimine may be represented by Formula B.

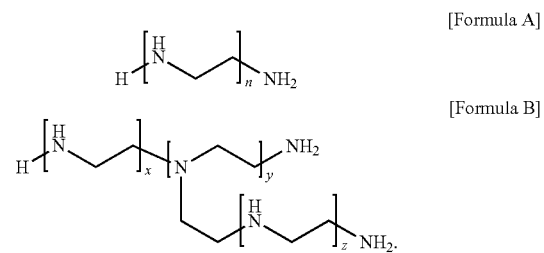

In an implementation, the polyethyleneimine may have a weight average molecular weight (Mw) of, e.g., about 500 g/mol to 1,000,000 g/mol, about 1,000 g/mol to about 500,000 g/mol, about 2,500 g/mol to about 250,000 g/mol, or about 5,000 g/mol to about 50,000 g/mol, as measured by GPC. Within this range, the abrasive agent containing the silica modified with the polyethyleneimine-derived aminosilane may help improve the polishing rate with respect to the insulating layer and the tungsten pattern wafer and may help suppress generation of surface defects (e.g., scratches or the like) upon polishing.

In an implementation, silica may be modified with the polyethyleneimine-derived aminosilane. The polyethyleneimine-derived aminosilane may include a reaction product of polyethyleneimine and a compound of Formula 1, a cation of the reaction product, or a salt of the reaction product.

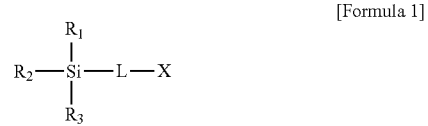

In an implementation, the cation of the reaction product of polyethyleneimine and a compound of Formula, 1 may mean that at least one nitrogen atom in the reaction product may have a cation (e.g., N+). In an implementation, in the reaction product of the polyethyleneimine and the compound of Formula 1, a cation may be the same as the cation mentioned above and an anion may include, e.g., halogen anions (e.g.: $F^-$, $Cl^-$, $Br^-$, and $I^-$); organic acid anions, e.g., carbonate anions (e.g.: $CO_3^{2-}$ and $HCO_3^-$), acetate anions ($CH_3COO^-$), citrate anions ($HOC(COO^-)(CH_2COO^-)_2$), or the like; or inorganic acid anions, e.g., nitrogen-containing anions (e.g.: $NO_3^-$, $NO_2^-$); phosphorus-containing anions (e.g.: $PO_4^{3-}$, $HPO_4^{2-}$, and $H_2PO_4^-$); sulfur-containing anions (e.g.: $SO_4^{2-}$ and $HSO_4^-$); cyanide anions ($CN^-$), or the like.

In Formula 1, L may be or include, e.g., a substituted or unsubstituted $C_1$ to $C_{20}$ alkylene group, a substituted or unsubstituted $C_3$ to $C_{20}$ cycloalkylene group, a substituted or unsubstituted $C_6$ to $C_{20}$ arylene group, or a combination thereof. In an implementation, L may be, e.g., a substituted or unsubstituted $C_1$ to $C_{10}$ alkylene group. In an implementation, L may be, e.g., a substituted or unsubstituted $C_1$ to $C_5$ alkylene group. In an implementation, L may be, e.g., an n-propylene group.

In Formula 1, X may be or include, e.g., F, Cl, Br, I, an epoxy group, or a glycidyloxy group. In an implementation, X may be, e.g., Cl or a glycidyloxy group.

In Formula 1, $R_1$ to $R_3$ may each independently be or include, e.g., hydrogen, a hydroxyl group, a substituted or unsubstituted $C_1$ to $C_{20}$ alkyl group, a substituted or unsubstituted $C_3$ to $C_{20}$ cycloalkyl group, a substituted or unsubstituted $C_6$ to $C_{20}$ aryl group, a substituted or unsubstituted $C_1$ to $C_{20}$ alkoxy group, or a substituted or unsubstituted $C_6$ to $C_{20}$ aryloxy group. In an implementation, at least one of $R_1$ to $R_3$ may be, e.g., a hydroxyl group, a substituted or unsubstituted $C_1$ to $C_{20}$ alkoxy group, or a substituted or unsubstituted $C_6$ to $C_{20}$ aryloxy group. In an implementation, $R_1$ to $R_3$ may each independently be, e.g., hydrogen, a hydroxyl group, a substituted or unsubstituted $C_1$ to $C_{10}$ alkyl group, or a substituted or unsubstituted $C_1$ to $C_{10}$ alkoxy group. In an implementation, at least one of $R_1$ to $R_3$ may be, e.g., a hydroxyl group or a substituted or unsubstituted $C_1$ to $C_{10}$ alkoxy group. In an implementation, $R_1$ to $R_3$ may each independently be, e.g., a hydroxyl group, a substituted or unsubstituted $C_1$ to $C_5$ alkyl group, or a substituted or unsubstituted $C_1$ to $C_5$ alkoxy group. In an implementation, at least one of $R_1$ to $R_3$ may be, e.g., a hydroxyl group or a substituted or unsubstituted $C_1$ to $C_5$ alkoxy group. In an implementation, $R_1$ to $R_3$ may each independently be, e.g., a substituted or unsubstituted methoxy group or a substituted or unsubstituted ethoxy group.

In an implementation, the compound of Formula 1 may be, e.g., chloropropyltrimethoxysilane, chloropropyltriethoxysilane, glycidyloxypropyltrimethoxysilane, or glycidyloxypropyltriethoxysilane.

The silica modified with the reaction product of the polyethyleneimine and the compound of Formula 1, the cation of the reaction product, or the salt of the reaction product may be obtained by adding the compound, the cation, or the salt to non-modified silica, followed by reaction for a predetermined period of time. The non-modified silica may include, e.g., colloidal silica or fumed silica. In an implementation, the non-modified silica may include, e.g., colloidal silica.

In an implementation, the silica modified with the polyethyleneimine-derived aminosilane may have a positive charge on a surface thereof, a surface potential of about 10 mV to about 60 mV (e.g., 10 mV, 20 mV, 30 mV, 40 mV, 50 mV, or 60 mV), and an isoelectric point present at a pH of about 6 to about 10, e.g., a pH of about 6 to about 8 or a pH of about 7 to about 8.

In an implementation, the CMP slurry composition may further include, e.g., an oxidizing agent, a catalyst, or an organic acid.

Oxidizing Agent

The oxidizing agent may facilitate polishing of the tungsten pattern wafer by oxidizing the tungsten pattern wafer.

The oxidizing agent may oxidize the tungsten pattern wafer to facilitate polishing of the tungsten pattern wafer.

The oxidizing agent may include, e.g., an inorganic percompound, an organic percompound, bromic acid or salts thereof, nitric acid or salts thereof, chloric acid or salts thereof, chromic acid or salts thereof, iodic acid or salts thereof, iron or salts thereof, copper or salts thereof, rare-earth metal oxides, transition metal oxides, potassium dichromate, or mixtures thereof. Here, the percompound refers to a compound that contains at least one peroxidation or peroxide group (—O—O—) or an element in the highest oxidation state. In an implementation, the oxidizing agent may include a percompound (e.g., hydrogen peroxide, potassium periodide, calcium persulfate, potassium ferricyanide, or the like). In an implementation, the oxidizing agent may be, e.g., hydrogen peroxide.

In the CMP slurry composition, the oxidizing agent may be present in an amount of, e.g., about 0.01 wt % to about 20 wt %, about 0.05 wt % to about 10 wt %, or about 0.1 wt % to about 5 wt %. Within this range, the CMP slurry composition may help improve the polishing rate of the tungsten metal layer.

Catalyst

The catalyst may help improve the polishing rate of the tungsten pattern wafer. In an implementation, the catalyst may include, e.g., an iron ion compound, a complex compound of iron ions, or a hydrate thereof.

The iron ion compound may include an iron trivalent cation-containing compound. The iron trivalent cation-containing compound may include a suitable compound having iron trivalent cations, which are present as free cations in an aqueous solution. In an implementation, the iron trivalent cation-containing compound may include, e.g., iron chloride ($FeCl_3$), iron nitrate ($Fe(NO_3)_3$), or iron sulfate ($Fe_2(SO_4)_3$).

The complex compound of iron ions may include, e.g., an iron trivalent cation-containing complex compound. The iron trivalent cation-containing complex compound may include a compound formed by reacting an iron trivalent cation with an organic or inorganic compound having at least one functional group, e.g., a carboxylic acid, a phosphoric acid, a sulfuric acid, an amino acid, or an amine, in an aqueous solution. Examples of the organic or inorganic compound may include citrate, ammonium citrate, p-toluene sulfonic acid (pTSA), 1,3-propylenediaminetetraacetic acid (PDTA), ethylenediaminetetraacetic acid (EDTA), diethylenetriaminepentaacetic acid (DTPA), nitrilotriacetic acid (NTA), and ethylenediamine-N,N'-disuccinic acid (EDDS). Examples of the iron trivalent cation-containing compound may include ferric citrate, ferric ammonium citrate, Fe(III)-pTSA, Fe(III)—PDTA, and Fe(III)-EDTA.

In the CMP slurry composition, the catalyst, e.g., the iron ion compound, the complex compound of iron ions, or the hydrate thereof, may be present in an amount of, e.g., about 0.001 wt % to about 10 wt %, about 0.001 wt % to about 5 wt %, about 0.001 wt % to about 1 wt %, or about 0.001 wt % to about 0.5 wt %. Within this range, the CMP slurry composition may help improve the polishing rate of the tungsten metal layer.

Organic Acid

The organic acid may help stabilize pH of the CMP slurry composition. The organic acid may include, e.g., a polycarboxylic acid, such as malonic acid, maleic acid, malic acid, or the like, or an amino acid, such as glycine, isoleucine, leucine, phenylalanine, methionine, threonine, tryptophan, valine, alanine, arginine, cysteine, glutamine, histidine, proline, serine, tyrosine, or lysine, or the like.

In the CMP slurry composition, the organic acid may be present in an amount of, e.g., about 0.001 wt % to about 20 wt %, about 0.01 wt % to about 10 wt %, about 0.01 wt % to about 5 wt %, or about 0.01 wt % to about 1 wt %. Within this range, the organic acid may help stabilize pH of the CMP slurry composition.

The CMP slurry composition may have a pH of about 4 to about 7, e.g., greater than about 4 to about 7, about 4 to about 6, greater than about 4 to about 6, about 4.5 to about 6, greater than about 4.5 to about 6, or about 5 to about 6. Within this range, the CMP slurry composition containing the modified silica as the abrasive agent may realize a high polishing rate of the tungsten pattern wafer upon polishing in a sub-acidic or low acidic pH condition, as compared with in a strongly acidic condition.

In an implementation, the CMP slurry composition may further include a pH regulator to help maintain a suitable pH value.

pH Regulator

The pH regulator may include an inorganic acid, e.g., nitric acid, phosphoric acid, hydrochloric acid, or sulfuric acid, or an organic acid, e.g., an organic acid having a pKa value of about 6 or less, such as acetic acid or phthalic acid. In an implementation pH regulator may include, e.g., an ammonia solution, sodium hydroxide, potassium hydroxide, ammonium hydroxide, sodium carbonate, or potassium carbonate.

The CMP slurry composition may further include a suitable additive, e.g., biocides, surfactants, dispersants, modifiers, surface activating agents, or the like. In the CMP slurry composition, the additive may be present in an amount of, e.g., about 0.001 wt % to about 5 wt %, about 0.001 wt % to about 1 wt %, or about 0.001 wt % to about 0.5 wt %. Within this range, the additives may realize effects thereof without affecting the polishing rate.

In accordance with another embodiment, there is provided a method of polishing a tungsten pattern wafer. The polishing method may include polishing a tungsten pattern wafer using the CMP slurry composition according to an embodiment.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Details of components used in the Examples and Comparative Examples are as follows.

(1) Non-modified abrasive agent: Colloidal silica having an average particle diameter ($D_{50}$) of 120 nm (PL-7, Fuso Chemical Industries)

(2) pH regulator: nitric acid or ammonia solution

Example 1

In terms of solid content of the non-modified abrasive agent, 0.04 mmol of trimethoxysilylpropyl-modified polyethylenimine (50% in isopropanol, Product Code: SSP-060, Gelest) was mixed with the non-modified abrasive agent and reacted under conditions of pH 2.5 at 25° C. for 72 hours, thereby preparing silica modified with polyethyleneimine-derived aminosilane (average particle diameter ($D_{50}$): 125 nm).

A CMP slurry composition was prepared by mixing 1.5 wt % of the modified silica as an abrasive agent, 0.01 wt % of Fe(III)-EDTA as a catalyst, 0.15 wt % of acetic acid as an organic acid, and the balance of deionized water as a solvent, based on the total weight of the CMP slurry composition. The CMP slurry composition was regulated to a pH of 5.5 using a pH regulator. Then, 0.3 wt % of hydrogen peroxide was added as an oxidizing agent to the slurry composition.

Example 2

A CMP slurry composition was prepared in the same manner as in Example 1 except that the polyethyleneimine-derived aminosilane was prepared by dissolving 1.0 mmol of [3-(2,3-epoxypropoxy)propyl]trimethoxysilane (EPO, 98% purity, Sigma-Aldrich) and 3.0 mmol of hyperbranched polyethyleneimine (PEI, Mw=60,000, Sigma-Aldrich) in 150 mL toluene, followed by stirring the reaction product at 80° C. for 24 hours and decompression drying, and was used instead of trimethoxysilylpropyl-modified polyethyleneimine.

Comparative Example 1

A CMP slurry composition was prepared in the same manner as in Example 1 except that the non-modified abrasive agent was used.

Comparative Example 2

A CMP slurry composition was prepared in the same manner as in Example 1 except that silica was modified with aminopropyltriethoxysilane ((3-aminopropyl)triethoxysilane 99%, Sigma-Aldrich) instead of trimethoxysilylpropyl-modified polyethyleneimine.

Comparative Example 3

A CMP slurry composition was prepared in the same manner as in Example 1 except that the pH regulator was used to change pH of the CMP slurry composition to 3.9.

Comparative Example 4

A CMP slurry composition was prepared in the same manner as in Example 1 except that the pH regulator was used to change pH of the CMP slurry composition to 7.1.

Polishing evaluation was carried out on the CMP slurry compositions prepared in the Examples and the Comparative Examples under the following polishing conditions. Results are shown in Table 1.

[Polishing Evaluation Condition]
1. Polishing machine: Reflexion 300 mm (AMAT Co., Ltd.)
2. Polishing condition
   Polishing pad: VP3100/Rohm and Haas Company
   Head speed: 35 rpm
   Platen speed: 33 rpm
   Pressure: 1.5 psi
   Retainer Ring Pressure: 8 psi
   Slurry flow rate: 250 ml/min
   Polishing time: 60 sec
3. Polishing target
   A commercially available tungsten pattern wafer (MIT 854, 300 mm) A mixture was prepared by mixing a CMP slurry for tungsten polishing (STARPLA-NAR7000, Samsung SDI Co., Ltd.) with deionized water in a weight ratio of 1:2 and hydrogen peroxide was added to the mixture in an amount of 2 wt % based on the weight of the mixture, thereby preparing a mixed solution, which in turn was used to polish a tungsten pattern wafer. The tungsten pattern wafer was polished on a polishing machine (Reflexion LK300 mm) using an IC1010/SubaIV Stacked polishing pad (Rodel Co., Ltd.) under conditions of a head speed of 101 rpm, a platen speed of 33 rpm, a polishing pressure of 2 psi, a retainer ring pressure of 8 psi, and a mixed solution flow rate of 250 ml/min. Polishing was performed to remove a tungsten metal layer until oxide/metal patterns were exposed.
4. Analysis Method
   Polishing rate (unit: Å/min): A polishing rate of the tungsten metal layer was calculated based on electric resistance corresponding to difference in film thickness before and after polishing in evaluation under the above polishing conditions. A polishing rate of an insulating layer was calculated based on difference in film thickness before and after polishing under the above polishing conditions, in which the difference in film thickness was measured using a reflectometer.
   Flatness (erosion, unit: Å): After polishing a wafer using each of the CMP slurry compositions prepared in the Examples and the Comparative Examples under the above polishing conditions, a profile of a pattern was measured using Insight CAP Compact Atomic Profiler (Bruker Co., Ltd.). Erosion was calculated based on difference in height between peri-oxide and cell-oxide in a 0.18/0.18 μm pattern region of the polished wafer. A scanning speed was set to 100 μm/sec and a scan length was set to 2 mm.

TABLE 1

|  | Example 1 | Example 2 | Comparative Example 1 | Comparative Example 2 | Comparative Example 3 | Comparative Example 4 |
|---|---|---|---|---|---|---|
| pH | 5.5 | 5.5 | 5.5 | 5.5 | 3.9 | 7.1 |
| Polishing rate of tungsten metal layer | 30 | 30 | 10 | 10 | 20 | 25 |
| Polishing rate of insulating layer | 120 | 120 | 5 | 10 | 50 | 80 |
| Flatness | 150 | 150 | 800 | 550 | 300 | 400 |

As may be seen from Table 1, upon polishing a tungsten pattern wafer, the CMP slurry compositions of Examples 1 and 2 (prepared using silica modified with polyethyleneimine-derived aminosilane and having a pH value of about 4 to 7) exhibited a higher polishing rate and better flatness than the CMP slurry compositions of Comparative Examples 1 to 4.

By way of summation and review, a process of polishing a metal layer using the CMP composition may include polishing only the metal layer, polishing the metal layer and a barrier layer, and polishing the metal layer, the barrier layer, and an oxide layer. Among these steps, in the step of polishing the metal layer, the barrier layer and the oxide layer, a composition for polishing a tungsten pattern wafer may be used, and good polishing flatness may be achieved under conditions that the metal layer and the oxide layer are polished at a suitable polishing rate.

One or more embodiments may provide a CMP slurry composition for polishing a tungsten pattern wafer, which may help improve polishing rate and flatness of a tungsten pattern wafer while suppressing generation of scratch defects upon polishing.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A CMP slurry composition for polishing a tungsten pattern wafer, the composition comprising:
   a solvent; and
   an abrasive agent,
   wherein:
   the composition has a pH of about 4 to about 7, and
   the abrasive agent includes silica modified with a polyethyleneimine modified by a compound of Formula 1,

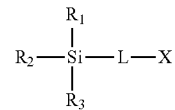

Formula 1 in Formula 1,
L is a substituted or unsubstituted $C_1$ to $C_{20}$ alkylene group, a substituted or unsubstituted $C_3$ to $C_{20}$ cycloalkylene group, a substituted or unsubstituted $C_6$ to $C_{20}$ arylene group, or a combination thereof;

X is F, Cl, Br, I, an epoxy group, or a glycidyloxy group;

$R_1$ to $R_3$ are each independently hydrogen, a hydroxyl group, a substituted or unsubstituted $C_1$ to $C_{20}$ alkyl group, a substituted or unsubstituted $C_3$ to $C_{20}$ cycloalkyl group, a substituted or unsubstituted $C_6$ to $C_{20}$ aryl group, a substituted or unsubstituted $C_1$ to $C_{20}$ alkoxy group, or a substituted or unsubstituted $C_6$ to $C_{20}$ aryloxy group, at least one of $R_1$ to $R_3$ being a hydroxyl group, a substituted or unsubstituted $C_1$ to $C_{20}$ alkoxy group, or a substituted or unsubstituted $C_6$ to $C_{20}$ aryloxy group, and the composition includes:
about 0.001 wt % to about 20 wt % of the abrasive agent,
about 0.01 wt % to about 20 wt % of an oxidizing agent,
about 0.001 wt % to about 10 wt % of a catalyst,
about 0.001 wt % to about 20 wt % of an organic acid, and
the solvent, all wt % being based on a total weight of the composition.

2. The CMP slurry composition as claimed in claim 1, wherein, in Formula 1:

L is a substituted or unsubstituted $C_1$ to $C_5$ alkylene group,

X is Cl or a glycidyloxy group, and $R_1$ to $R_3$ are each independently a hydroxyl group, a substituted or unsubstituted $C_1$ to $C_5$ alkyl group, or a substituted or unsubstituted $C_1$ to $C_5$ alkoxy group, at least one of $R_1$ to $R_3$ being a hydroxyl group or a substituted or unsubstituted $C_1$ to $C_5$ alkoxy group.

3. The CMP slurry composition as claimed in claim 1, wherein the compound of Formula 1 is chloropropyltrimethoxysilane, chloropropyltriethoxysilane, glycidyloxypropyltrimethoxysilane, or glycidyloxypropyltriethoxysilane.

4. The CMP slurry composition as claimed in claim 1, wherein the polyethyleneimine has a weight average molecular weight (Mw) of about 500 g/mol to about 1,000,000 g/mol, as measured by gel permeation chromatography (GPC).

5. The CMP slurry composition as claimed in claim 1, wherein the silica modified with the polyethyleneimine modified by a compound of Formula 1 has a positive charge on a surface thereof, a surface potential of about 10 mV to about 60 mV, and an isoelectric point of the silica is present at a pH of about 6 to about 10.

6. The CMP slurry composition as claimed in claim 1, wherein the silica modified with the polyethyleneimine modified by a compound of Formula 1 has an average particle diameter (D50) of about 10 nm to about 200 nm.

7. A method of polishing a tungsten pattern wafer, the method comprising polishing the tungsten pattern wafer using the CMP slurry composition as claimed in claim 1.

* * * * *